United States Patent [19]

Ito et al.

[11] Patent Number: 5,469,066
[45] Date of Patent: Nov. 21, 1995

[54] METHOD AND APPARATUS FOR MEASURING DETERIORATION OF POWER CABLE INSULATION

[75] Inventors: Akira Ito; Hiroaki Kamohara, both of Kitashigeyasu, Japan

[73] Assignee: Daiden Kabushiki Kaisha, Kitashigeyasu, Japan

[21] Appl. No.: 139,702

[22] Filed: Oct. 22, 1993

[30] Foreign Application Priority Data

Oct. 23, 1992 [JP] Japan .................. 4-309485

[51] Int. Cl.⁶ .................................. G01R 31/02
[52] U.S. Cl. .................. 324/551; 324/541; 324/544
[58] Field of Search .................. 324/541, 544, 324/539, 543, 527, 551; 340/647

[56] References Cited

U.S. PATENT DOCUMENTS

| | | | |
|---|---|---|---|
| 2,344,261 | 3/1944 | Mortlock | 324/544 |
| 3,546,581 | 12/1970 | Herrendeen et al. | 324/544 |
| 4,157,541 | 6/1979 | Harwell | 324/544 |
| 4,214,311 | 7/1980 | Nakashima | 324/541 |
| 4,721,916 | 1/1988 | Hanasawa et al. | 324/544 |
| 4,980,645 | 12/1990 | Soma et al. | 324/541 |
| 5,066,920 | 11/1991 | Suptitz | 324/544 |
| 5,276,401 | 1/1994 | Soma | 324/544 |
| 5,303,164 | 4/1994 | Masson et al. | 324/541 |

FOREIGN PATENT DOCUMENTS

| | | | |
|---|---|---|---|
| 0155773 | 7/1986 | Japan | 324/541 |
| 0266366 | 11/1988 | Japan | 324/541 |
| 0194371 | 7/1990 | Japan | 324/544 |
| 3-274476 | 12/1991 | Japan | 324/544 |
| 5-133995 | 5/1993 | Japan | 324/544 |

*Primary Examiner*—Maura K. Regan
*Attorney, Agent, or Firm*—Jones, Tullar & Cooper

[57] ABSTRACT

A system for detecting a power cable for water treeing and other forms of deterioration based on the dielectric loss of the insulation of the cable. An AC test signal is injected to the conductor of a sample of cable to be tested. The voltage drop appearing across a resistor connected to the insulation shield layer of the cable is measured by means of a lock-in amplifier. A phase shifter adds to the voltage drop a voltage signal that is 180 degrees out of phase with the reactive component of the voltage drop. The output of the lock-in amplifier is the active component of the voltage drop that is representative of the dielectric loss of the insulation of the cable. This approach permits an accurate and reliable detection of trees even if they have not spread out evenly in the power cable, as distinct from the conventional tan δ method.

14 Claims, 5 Drawing Sheets

METHOD AND APPARATUS FOR MEASURING DETERIORATION OF POWER CABLE INSULATION

BACKGROUND OF THE INVENTION

1. Field of the Invention

This invention relates to the testing of electrical power cables and, more particularly, to an improved method and apparatus for determining deterioration of power cable insulation by measuring the dielectric loss of the insulation. The invention provides a technique which permits an accurate and reliable detection of trees in a power cable even if they have not spread throughout the cable.

2. Description of Prior Art

One major cause for aging of power cables that can lead to premature breakdown is heat deterioration. The power cables are also subject to several other forms of deterioration known as water treeing or sulfide treeing. Treeing is the formation of microscopic patterns of weakened material in the cable insulation, and the water trees are considered to develop by penetration of water into the insulation in a tree-like pattern under the influence of an electrical potential. Particularly in case of polyethylene and cross-linked polyethylene insulated cables, moisture and sulfides entrained therein penetrate into the insulation, causing sulfide trees. As trees grow during in-service cable operation, the performance of the insulation deteriorates very quickly or gradually, which eventually causes cable failure. This will lead to consequent blackout and loss of electric power supply to the consumer.

In the prior art, several methods for determining deterioration of cable insulation are known. One method consists of impressing a high DC voltage such as 10 KV onto an inactive cable and measuring the resulting DC leakage current. Another method measures the dielectric loss angle (tan δ) of a cable during actual cable operating conditions. There are other methods which superimpose a DC or a low frequency voltage on an active cable to provide a positive indication of deterioration of cable insulation. However, these known approaches have certain inherent drawbacks. For example, the tan δ method cannot reliably determine the presence of water trees until their penetration across the entire insulation thickness becomes impending. It is true that the tan δ method can detect water trees if they have spread out evenly in the cable. However, there is a general tendency for water trees to develop in localized areas of the insulation rather than over the entire cable length. Accordingly, the tan δ method has proved ineffective for reliable and accurate detection of such localized water trees.

It is therefore the usual practice to use such test methods in combination and to comparatively analyze and synthesize the test results for evaluation and diagnosis of insulation deterioration. This will of course increase the reliability and accuracy of tree detection. However, there still remains a need for a straightforward and cost-effective technique for determining deterioration of power cable insulation. The present invention fulfills this need, and further provides related advantages.

It is therefore an object of this invention to provide an improved method and apparatus for determining deterioration of power cable insulation with a view to overcoming the above-stated drawbacks of the prior art.

It is another object of this invention to provide an improved method and apparatus for detecting the presence of water trees, sulfide trees and the like in power cables by measuring the dielectric loss of the cable insulation.

It is a further object of this invention to provide an improved method and apparatus that is capable of detecting penetration-type trees even if they have not spread evenly throughout the power cable.

It is a still further object of this invention to provide an improved method and apparatus which can detect the presence of trees with high reliability and accuracy but which is relatively simple and cost effective to implement.

SUMMARY OF THE INVENTION

These objects and other objects of the invention are accomplished in accordance with the principles of the invention by preparing a sample of cable to be tested; measuring the dielectric loss of the insulation layer of the cable sample; and determining deterioration of the insulation layer based on the magnitude of the dielectric loss as measured during the measuring step. The step of measuring dielectric loss comprises generating an AC test signal; applying the AC test signal to the central conductor to cause a voltage drop across the resistor; generating a voltage signal which is 180 degrees out of phase with the reactive component of the voltage drop across the resistor; adding the voltage signal to the voltage drop across the resistor to cancel out the reactive component of the voltage drop and to provide a signal indicative of the active component of the voltage drop; and measuring the active component of the voltage drop using a lock-in amplifier.

Further in accordance with this invention, there is provided a system for determining deterioration of power cable insulation, the power cable comprising a central conductor, an insulation layer surrounding the conductor and an electrically conductive insulation shield layer surrounding the insulation layer, comprising: means for measuring the dielectric loss of the insulation layer of a sample of power cable; and means for determining deterioration of the insulation layer of the cable sample based on the measured dielectric loss value. An AC test signal generator is employed to generate an AC test signal and apply it to the central conductor of a powercable sample. A resistor is provided having one end adapted to be connected to the insulation shield layer of the cable sample and the other end connected to a reference potential. Connected to the resistor is a lock-in amplifier for measuring the magnitude of the voltage drop across the resistor means. A phase shifter is provided to generate a voltage signal that is 180 degrees out of phase with the reactive component of the voltage drop across the resistor, the voltage signal being added to the voltage drop to cancel out the reactive component thereof. The magnitude of the active component of the voltage drop is representative of the dielectric loss of the insulation layer of the cable sample.

DETAILED DESCRIPTION OF PREFERRED EMBODIMENTS

Figure 1:
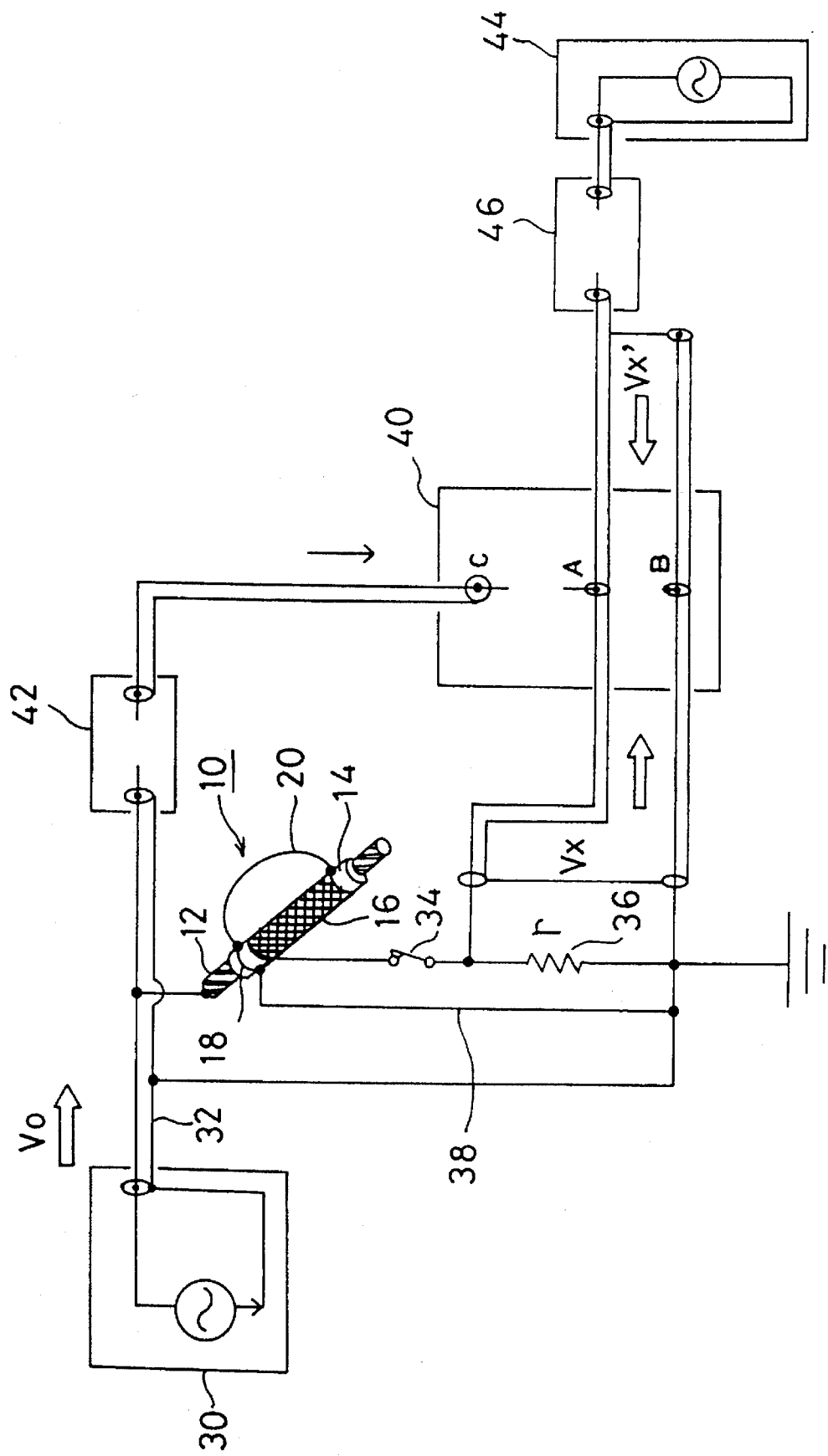
FIG. 1 is a schematic view showing the principles of this invention.

Referring to FIG. 1, reference numeral 10 indicates a power cable sample that is to undergo testing for deterioration. It includes a conductor 12, an insulation layer 14, and an insulation shield layer 16. Since the insulation layer 14 is sandwiched between the conductor 12 and the insulation shield layer 16, this arrangement provides an electric capacitor. As shown, two guards 18 are mounted on the insulation layer 14 and connected to each other through a wire 20 for the purpose of draining surface leakage current which would otherwise flow from the conductor to the insulation shield layer.

In accordance with this invention, the dielectric loss of the insulation layer 14 is measured to provide a positive indication that the cable insulation has deteriorated, or to indicate the presence of trees in the cable. The "dielectric loss" is defined as the electric energy that is converted into heat in a dielectric material subjected to a varying electric field.

In accordance with the principles of this invention, the procedure for measuring the dielectric loss of the insulation of the cable sample 10 is as follows: The conductor 12 is connected to an AC voltage source or oscillator 30 (adjusted to a predetermined frequency and voltage) by way of a coaxial or shielded cable 32. The insulation shield layer 16 is connected to ground by way of a switch 34 and a resistor 36. The guards 18 are also connected to ground by way of another lead 38. In this manner, the AC signal generated by the AC voltage source 30 is applied across the insulation layer 14 between the conductor 12 and the insulation shield layer 16. As mentioned above, the power supply 30 is preferably adjusted to, e.g., 6 volts. The frequency of the AC signal is variably adjusted to the range of 1 Hz to 10 KHz.

Figure 2:
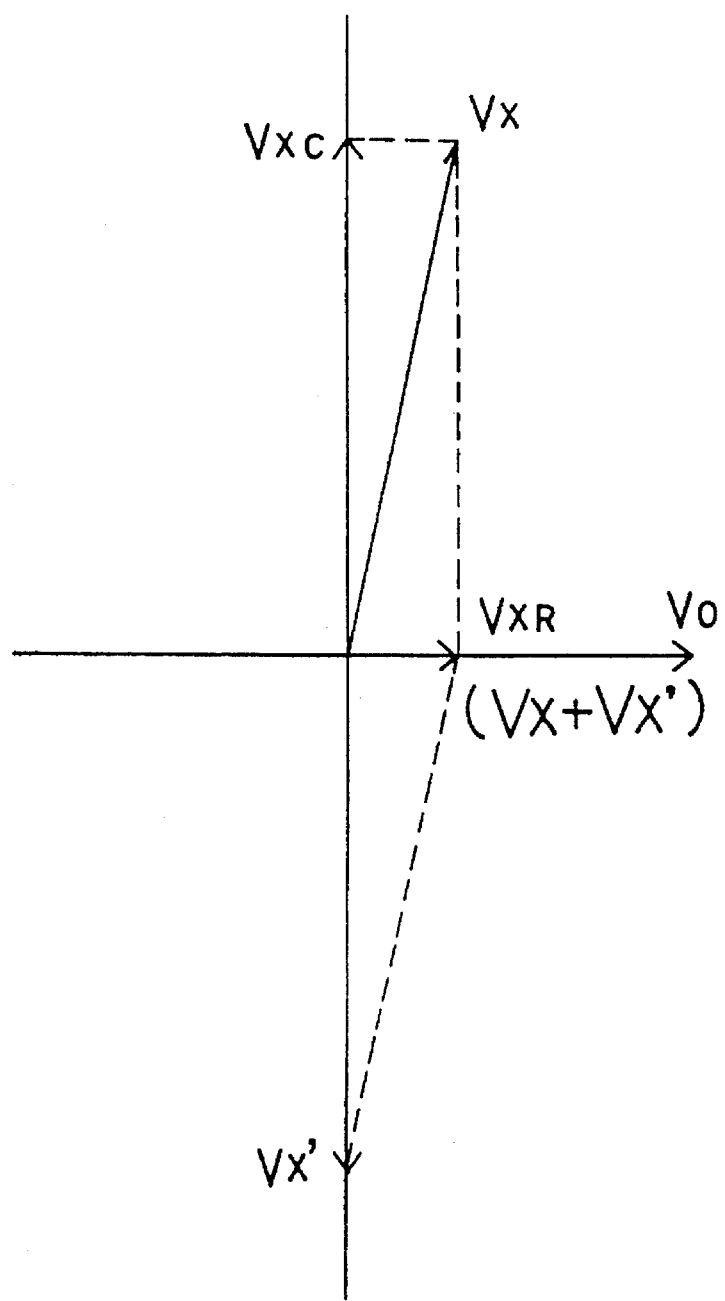
FIG. 2 is a vector diagram useful for explaining the principles of the invention.

The test apparatus of FIG. 1 includes a lock-in amplifier 40 which measures the voltage drop $V_x$ across the resistor 36, which is applied between signal input terminals A and B. Measurement of this voltage drop is made in relation to a reference voltage $V_R$ which is fed from the power source 30 to a reference input terminal C by way of a first attenuator 42. A phase shifter 44 is used to cancel out the reactive voltage component $V_{xc}$ of the voltage drop $V_x$ by producing and applying a voltage signal $V_{x'}$, that is 180 degrees out of phase from the reactive component, as best seen in FIG. 2. The voltage source of the phase shifter 44 is synchronzed in phase with that of the power source 30. The voltage signal $V_{x'}$ is applied to the signal input terminal A by way of a second attenuator 46. The gain of the second attenuator 46 is adjusted such that the output of the lock-in amplifier 40 is minimized. Also, the lock-in amplifier 40 is adjusted to reduce the phase difference between the reference signal and the phase shifter output to as low as 5 degrees. When the amplifier output shows a minimum, the reading of the minimum output value $V_{xR}$ is taken.

As the next step, the switch 34 is opened for the purpose of measuring the noise component $V_n$ of the amplifier output. The amplifier output is read with the switch open, and the reading is subtracted from the output reading taken with the switch closed. The resultant difference in the amplifier output provides an accurate representation of the dielectric loss of the insulation layer 14.

In order to verify the effectiveness of the test method of this invention, the following cable samples were prepared for comparative testing:

Category No. 1:
A brand new cross-linked polyethylene insulated cable which is 20 meters in length and 8 mm$^2$ in cross section
Category No. 2:
Ten 1 meter long samples of cable having a cross section between 38 and 500 mm$^2$, which have numerous water trees developed. (These samples were prepared by cutting off those portions of various field operated power cables that have exhibited extensive water treeing from visual inspection, and immersing them into water for over a week, in order to simulate the actual cable operating conditions).
Category No. 3:
Several "composite" cable samples comprising the cable of Category No. 1 and a sample of Category No. 2, which are connected in series to each other to simulate cables that exhibit water treeing in localized areas.

Figure 3:
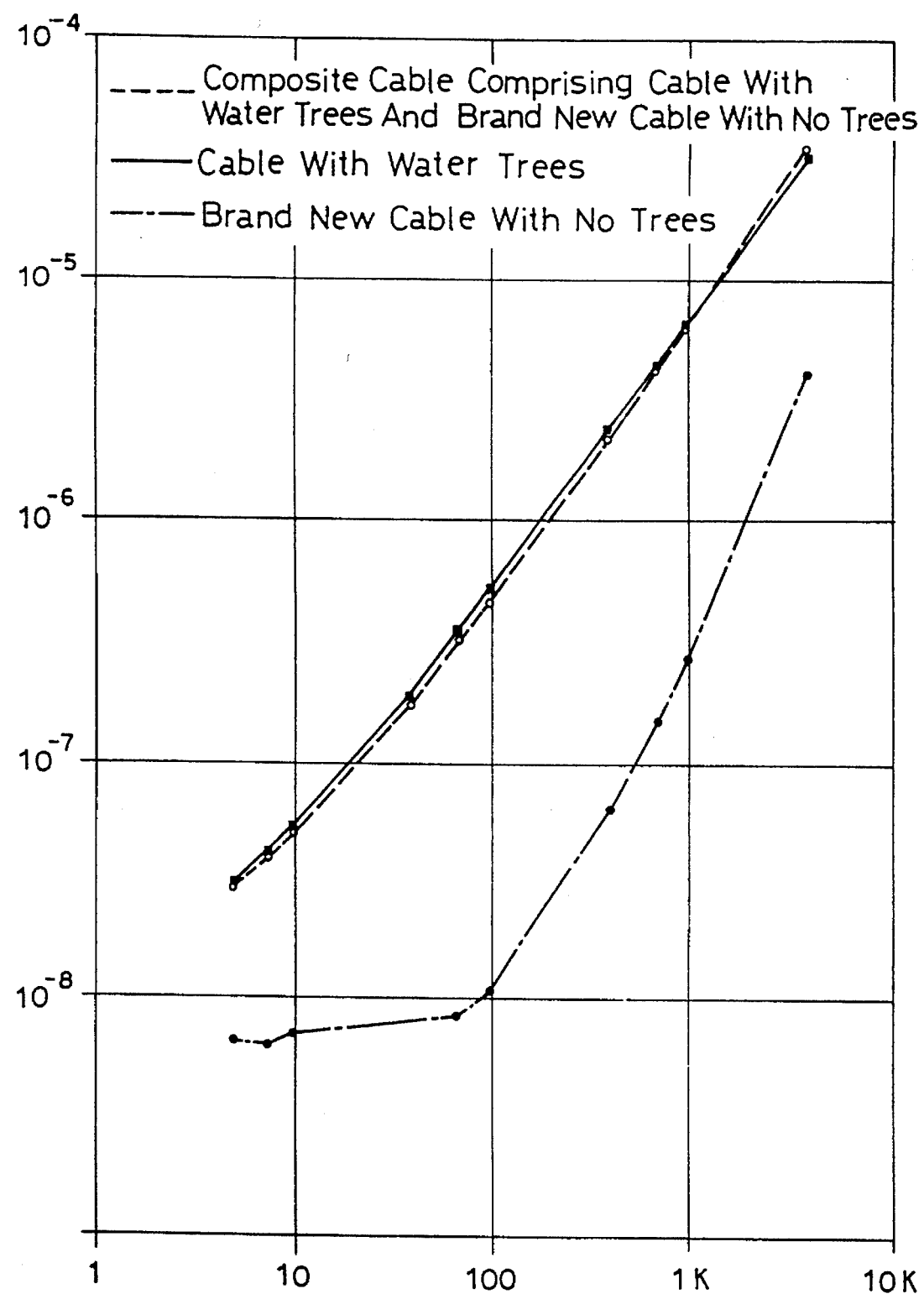
FIG. 3 is a plot of the dielectric loss of the insulation of various cable samples as measured against the frequency of an impressed current.

Tests were conducted on these samples using the apparatus of FIG. 1, and the results are shown in FIG. 3 which is a plot of the dielectric loss of the insulation of the sample cables as measured against the frequency of the AC test signal applied by the power source 30.

As shown in FIG. 3, the curves of the dielectric loss of the samples of Category Nos. 2 and 3 overlap substantially, and they are significantly greater than that of Category No. 1. This verifies that the present test method is effective to detect the presence of water trees in a power cable even if they have developed only in localized areas of the cable.

Figure 4:
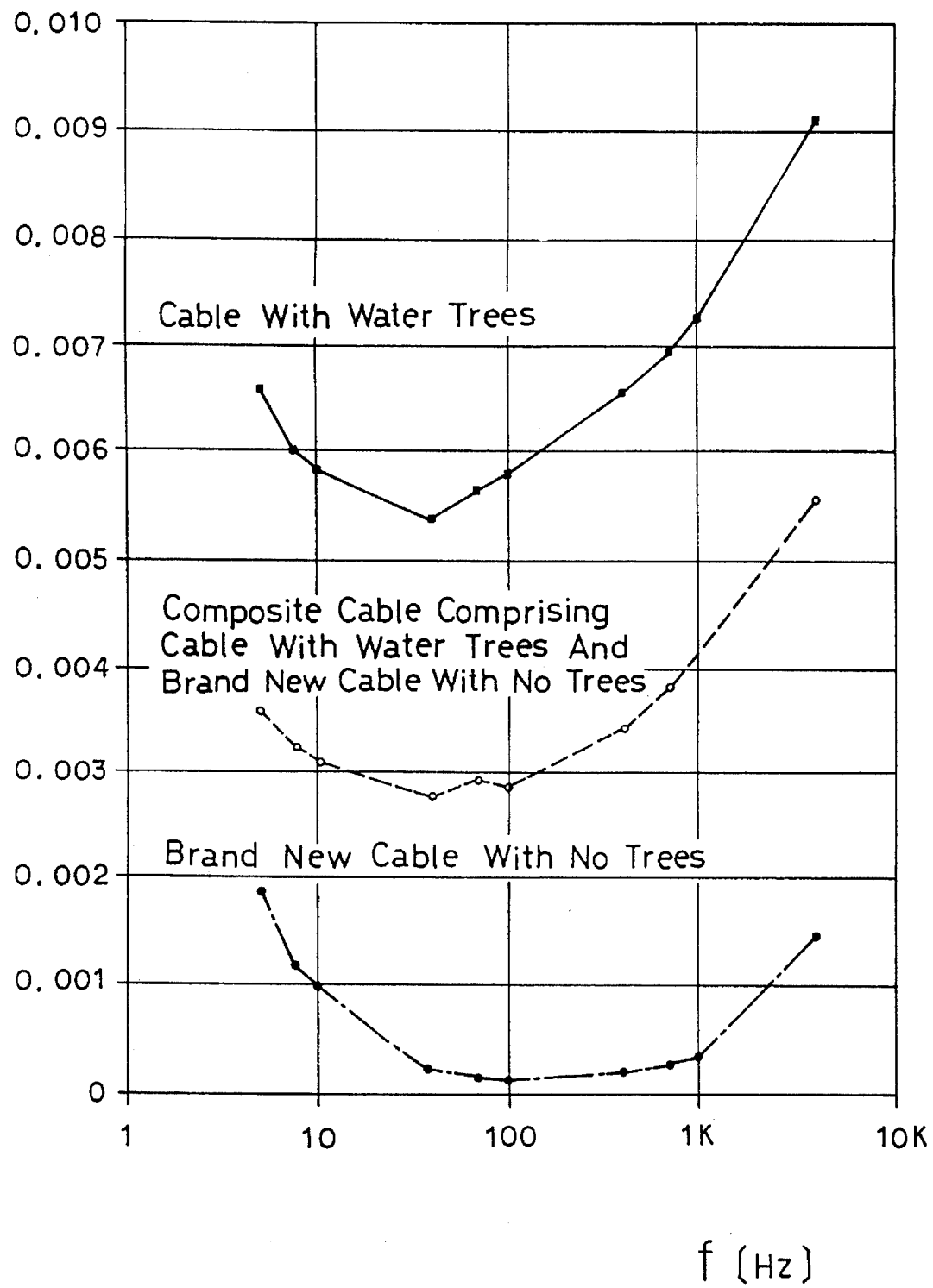
FIG. 4 is a plot of the dielectric loss angle (tan δ) of the insulation of similar cable samples as measured against the frequency of an impressed current.

This is to be contrasted with the plot of FIG. 4 which shows the results of measurements of the dielectric loss angle or tan δ for the same set of cable samples. As shown in FIG. 4, the samples of Category No. 2 having water trees extensively developed have significantly greater dielectric loss angles than those of Category No. 3 exhibiting localized water treeing, and this is due to the electrostatic capacitance of the cables. It should be noted that the conventional method of measuring the dielectric loss angle or tan δ is not very effective to distinguish between samples of Category Nos. 2 and 3. This invention provides significant improvements over the tan δ method in permitting an accurate and reliable detection of the presence of water trees whether they have spread out in the cable or developed only in the localized areas.

The Applicants have also conducted extensive tests on power cables exhibiting heat deterioration or sulfide treeing and found that these forms of cable deterioration have also resulted in significant increases in the dielectric loss in such a manner as to enable distinguishing between cables exhibiting extensive and localized deterioration and accordingly the test method of this invention is equally effective to determine such deterioration.

Figure 5:
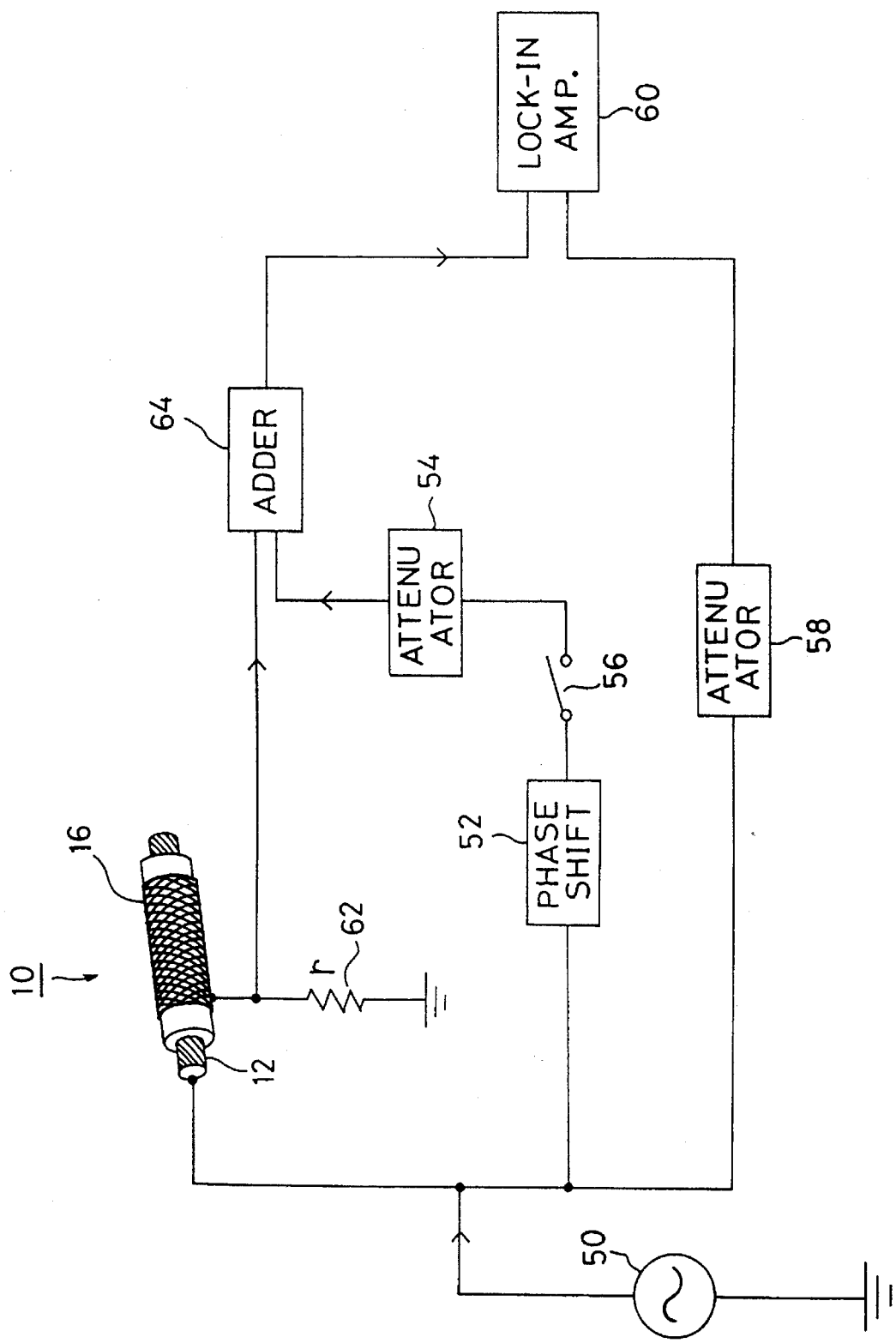
FIG. 5 is a block diagram showing a preferred embodiment of the invention.

FIG. 5 is a block diagram of a preferred embodiment of this invention. As shown, the test apparatus includes an oscillator 50 having its output connected to the conductor 12 of a sample 10 of cable to be tested. The output of the oscillator 50 is also connected to the input of a phase shifter 52 which is responsive to the oscillator output by introducing therein a phase delay of 90degrees. The output of the phase shifter 52 is connected to an attenuator 54 by way of a switch 56. The output of the oscillator 50 is further connected to the input of another attenuator 58 whose output is connected to the reference input terminal of a lock-in amplifier 60.

The cable sample 10 has an insulation shield layer 16 connected to ground by way of a resistor 62. Although not shown, another switch may be connected between the insulation shield layer 16 and the resistor 62 to permit a measurement of the noise component for subsequent cancellation thereof. The junction between the resistor 62 and the insulation shield layer 16 of the cable 10 is connected to one input of an adder circuit 64 which responds to the output of the attenuator 54 also by providing an output representative of the sum of the voltage drop across the resistor 62 and the output voltage of the attenuator 54. The output of the adder circuit 64 is applied to the signal input terminal of the lock-in amplifier 60.

As in the test apparatus of FIG. 1, the phase shifter 52 is adjusted to provide a voltage signal $V_{x'}$ which is 180 degrees out of phase with the reactive component of the voltage drop $V_x$ across the resistor 62. The attenuator 54 is also adjusted such that the sum of the input signals applied to the adder circuit 64 is reduced to a minimum.

The procedure for measuring the dielectric loss of cable insulation is as follows:

(1) A sample 10 of cable to be tested is connected to the test apparatus by connecting the conductor 12 and the insulation shield layer 16 of the cable to the output of the oscillator 50 and the junction between the resistor 62 and the input of the adder circuit 64, respectively.

(2) With the switch 56 in the open position, the oscillator 50 is activated to apply a test signal $V_O$ to the sample 10, and the resultant voltage drop $V_x$ across the resistor 62 is measured using the lock-in amplifier 60. shifted signal $V_{x'}$ to the adder circuit 64 by way of the attenuator 54, and the lock-in amplifier 60 is used to measure the resultant output, $V_{x'}+V_{x'}$, from the adder circuit 64 in relation to the reference signal. In this process, the attenuator 58 is adjusted such that the output of the lock-in amplifier 60 is reduced to a minimum. The output of the lock-in amplifier 60 is indicative of the dielectric loss of the insulation of the cable sample 10.

In the illustrated embodiments, the separate oscillator 30 or 50 is employed to generate and apply the test voltage to a cable sample. However, it is possible to use the commercial voltage of 50 or 60 Hz as the test signal. Also, it should be noted that modifying the present test apparatus to measure the dielectric loss of the insulation of a power cable during in-service operation is within the skill of a person having ordinary knowledge in the art. Specifically, the test appratus can be coupled to an active power cable by way of isolation transformers (not shown).

As described above, this invention permits a reliable and accurate determination of the deterioration of power cable insulation by measuring the dielectric loss of the insulation of a cable sample, followed by comparing the measured value with that of a brand new power cable undergoing no deterioration. Since the measurements of dielectric loss for a cable exhibiting localized treeing and a cable showing extensive treeing throughout it are at substantially the same levels but significantly greater than those for the brand new cable, this invention makes it possible to easily and readily distinguish therebetween, as distinct from the conventional tan δ method.

It is thought that this invention and many of its attendant advantages will be understood from the foregoing description and it will be apparent that various changes may be made in the form, construction and arrangement of the components thereof without departing from the spirit and scope of the invention or sacrificing all of its material advantages, the form hereinbefore described being merely a preferred or exemplary embodiment thereof.

What is claimed is:

1. A method for testing a power cable for localized treeing, the cable comprising a central conductor, an insulation layer surrounding the conductor and an electrically conductive insulation shield surrounding the insulation layer, comprising:

preparing a sample of cable to be tested;
   connecting the insulation shield layer of the cable to a grounded resistor;
   measuring the dielectric loss of the insulation layer of the cable sample; and
   determining the localized treeing of the insulation layer based on the magnitude of the dielectric loss as measured during the measuring step;
   said measuring step comprising:
      generating an AC test signal;
      applying the AC test signal to the central conductor to cause a voltage drop across the resistor;
      generating a voltage signal which is 180 degrees out of phase with the reactive component of the voltage drop across the resistor;
      adding the voltage signal to the voltage drop across the resistor to cancel out the reactive component of the voltage drop;
      adjusting the magnitude of the voltage signal such that the sum of the voltage signal and the voltage drop as measured by a lock-in amplifier is reduced to a minimum to provide a signal indicative of the active component of the voltage drop; and
      measuring the active component of the voltage drop using the lock-in amplifier.

2. The method as defined in claim 1 wherein the determining step includes comparing the magnitude of the dielectric loss of the cable sample with that of a reference cable which exhibits no deterioration.

3. The method as defined in claim 1 wherein the frequency of the AC test signal is varied within a predetermined range.

4. The method as defined in claim 3 wherein the predetermined range of frequency is from 1 Hz to 10 KHz.

5. The method as defined in claim 1 wherein the magnitude of the AC test signal is approximately 6 volts.

6. The method as defined in claim 1 further comprising:
   connecting a switch between the insulation shield layer of the cable sample and the resistor;
   holding the switch in an open position; and
   measuring the active component of the voltage drop across the resistor that is indicative of the noise component of the voltage drop.

7. A system for testing a power cable for localized treeing, the power cable comprising a central conductor, an insulation layer surrounding the conductor and an electrically conductive insulation shield layer surrounding the insulation layer, comprising;
   means for measuring the dielectric loss of the insulation layer of a sample of power cable; and
   means for determining the localized treeing of the insulation layer of the cable sample based on the measured dielectric loss value,
   said means for measuring dielectric loss comprising:
      an AC test signal generator adapted to generate an AC test signal and apply it to the central conductor of a sample of cable;
      resistor means having one end adapted to be connected to the insulation shield layer of the cable sample and the other end connected to a reference potential;
      means connected to the resistor means to measure the magnitude of the voltage drop across the resistor means;

means for generating a voltage signal that is 180 degrees out of phase with the reactive component of the voltage drop across the resistor means, the voltage signal being added to the voltage drop to cancel out the reactive component thereof; and means for adjusting the magnitude of the voltage signal such that the sum of the voltage signal and the voltage drop is reduced to a minimum to provide a signal indicative of the active component of the voltage drop;

the magnitude of the active component of the voltage drop being representative of the dielectric loss of the insulation layer of the cable sample.

8. The system as defined in claim 7 wherein the means for measuring dielectric loss comprises:

an AC test signal generator adapted to generate an AC test signal and apply it to the central conductor of a sample of power cable;

resistor means having one end adapted to be connected to the insulation shield layer of the cable sample and the other end connected to a reference potential;

means connected to the resistor means to measure the magnitude of the voltage drop across the resistor means; and means for generating a voltage signal that is 180 degrees out of phase with the reactive component of the voltage drop across the resistor means, the voltage signal being added to the voltage drop to cancel out the reactive component thereof;

the magnitude of the active component of the voltage drop being representative of the dielectric loss of the insulation layer of the cable sample.

9. The system as defined in claim 8 wherein the AC test signal generator includes an oscillator that is capable of generating an output signal of variable frequency.

10. The system as defined in claim 9 wherein the oscillator output has a frequency range of 1 Hz to 10 KHz.

11. The system as defined in claim 8 wherein the magnitude of the generator output is approximately 6 volts.

12. The system as defined in claim 9 wherein the means connected to the resistor means to measure the magnitude of the voltage drop comprises a lock-in amplifier having a reference input connected to the output of the oscillator by way of an first attenuator.

13. The system as defined in claim 12 wherein the means for generating the 180 degrees out of phase voltage signal comprises a phase shifter which is connected to the output of the oscillator by way of a second attenuator.

14. The system as defined in claim 8 wherein the one end of the resistor means is connected to the insulation shield layer of the cable sample by way of a normally closed switch means, the switch means being held in an open position to disconnect the resistor means from the cable sample to permit measuring the active component of the voltage drop that is indicative of the noise component thereof.

* * * * *